US011914298B2

(12) United States Patent
Kunugimoto et al.

(10) Patent No.: US 11,914,298 B2
(45) Date of Patent: Feb. 27, 2024

(54) LIQUID PROCESSING APPARATUS AND METHOD OF DETECTING LIQUID IN LIQUID PROCESSING APPARATUS

(71) Applicant: Tokyo Electron Limited, Tokyo (JP)

(72) Inventors: Yuichiro Kunugimoto, Koshi (JP); Takafumi Hayama, Koshi (JP); Hidehiro Suzuki, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/016,643

(22) Filed: Sep. 10, 2020

(65) Prior Publication Data
US 2021/0080830 A1 Mar. 18, 2021

(30) Foreign Application Priority Data

Sep. 12, 2019 (JP) .................................. 2019-165931

(51) Int. Cl.
G03F 7/16 (2006.01)
H01L 21/67 (2006.01)
B05B 15/50 (2018.01)

(52) U.S. Cl.
CPC ............. G03F 7/162 (2013.01); B05B 15/50 (2018.02); H01L 21/6715 (2013.01); H01L 21/67253 (2013.01)

(58) Field of Classification Search
CPC .... B05B 15/50; G03F 7/162; H01L 21/67253
See application file for complete search history.

(56) References Cited

U.S. PATENT DOCUMENTS

| 5,942,035 | A  | * | 8/1999  | Hasebe ............. H01L 21/67017 118/313 |
| 2006/0236926 | A1 | * | 10/2006 | Shiba ...................... G03F 7/162 118/52 |
| 2007/0077671 | A1 | * | 4/2007  | David ..................... B24B 49/12 438/29 |
| 2011/0286738 | A1 | * | 11/2011 | Noda ................ H01L 21/67253 396/611 |
| 2015/0234277 | A1 | * | 8/2015  | Kunugimoto ......... G03F 7/3021 355/27 |

FOREIGN PATENT DOCUMENTS

| JP | H10-54748 A   | 2/1998 |
| JP | 2005-210059 A | 8/2005 |
| JP | 2015-153903 A | 8/2015 |

* cited by examiner

Primary Examiner — Dah-Wei D. Yuan
Assistant Examiner — Stephen A Kitt
(74) Attorney, Agent, or Firm — Nath, Goldberg & Meyer; Jerald L. Meyer; Tanya E. Harkins

(57) ABSTRACT

There is provided a liquid processing apparatus comprising: a stage on which a substrate is placed; a nozzle configured to supply a processing liquid to the substrate placed on the stage and perform a processing on the substrate; a capturing part configured to capture an image of the nozzle so as to acquire image data; and a detector configured to detect a liquid level based on a plurality of the image data acquired by the capturing part at different timings within a period in which a supply of the processing liquid from the nozzle is not performed, wherein the liquid level is formed by the processing liquid or a liquid other than the processing liquid in a processing liquid flow path provided inside the nozzle.

11 Claims, 11 Drawing Sheets

LIQUID PROCESSING APPARATUS AND METHOD OF DETECTING LIQUID IN LIQUID PROCESSING APPARATUS

CROSS-REFERENCE TO RELATED APPLICATION

This application is based upon and claims the benefit of priority from Japanese Patent Application No. 2019-165931, filed on Sep. 12, 2019, the entire contents of which are incorporated herein by reference.

TECHNICAL FIELD

The present disclosure relates to a liquid processing apparatus and a method of detecting liquid in the liquid processing apparatus.

BACKGROUND

In a process for manufacturing a semiconductor device, a semiconductor wafer (hereinafter, referred to as a "wafer"), which is a substrate, is processed by ejecting various types of processing liquids, such as a resist, from nozzles. Patent Document 1 discloses a technique of repeatedly capturing an image of a nozzle over time using an image capturing part, acquiring data of foreign matter existing in an ejection port of the nozzle, and determining whether or not an abnormality occurs. In Patent Document 1, the foreign matter is described as a droplet, a solid, or a scratch.

PRIOR ART DOCUMENT

Patent Document

Patent Document 1: Japanese Laid-Open Patent Publication No. 2015-153903

SUMMARY

According to one embodiment of the present disclosure, there is provided a liquid processing apparatus including: a stage on which a substrate is placed; a nozzle configured to supply a processing liquid to the substrate placed on the stage and perform a processing on the substrate; a capturing part configured to capture an image of the nozzle so as to acquire image data; and a detector configured to detect a liquid level based on a plurality of the image data acquired by the capturing part at different timings within a period in which a supply of the processing liquid from the nozzle is not performed, wherein the liquid level is formed by the processing liquid or a liquid other than the processing liquid in a processing liquid flow path provided inside the nozzle.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A resist film forming apparatus 1, which is an embodiment of a liquid processing apparatus of the present disclosure will be described with reference to a perspective view of FIG. 1 and a vertical cross-sectional view of FIG. 2. The resist film forming apparatus 1 forms a resist film by supplying a resist as a processing liquid to a wafer W and coating the resist on the wafer W through spin coating.

Figure 1:
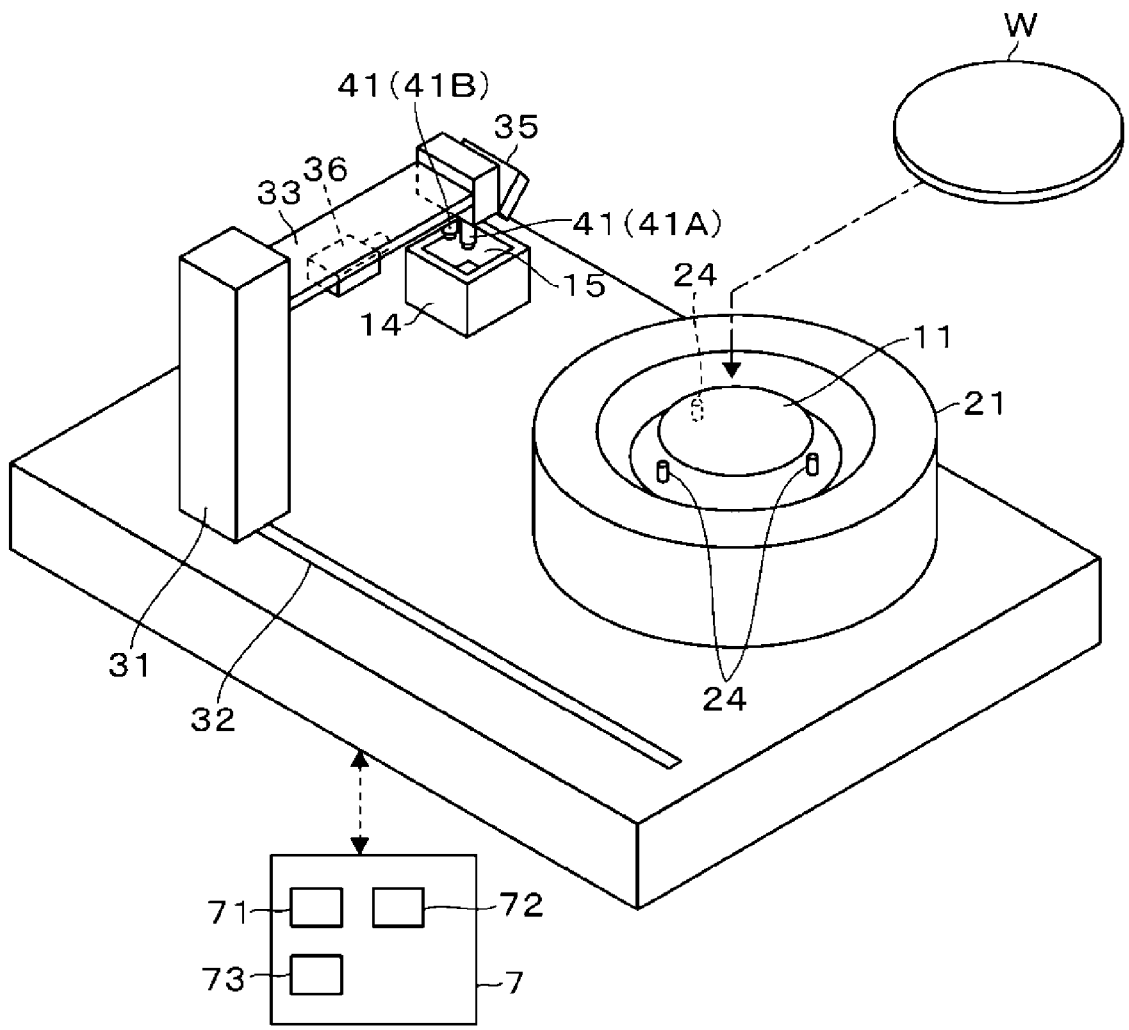
FIG. 1 is a perspective view of a resist film forming apparatus which is an embodiment of a liquid processing apparatus of the present disclosure.
Figure 2:
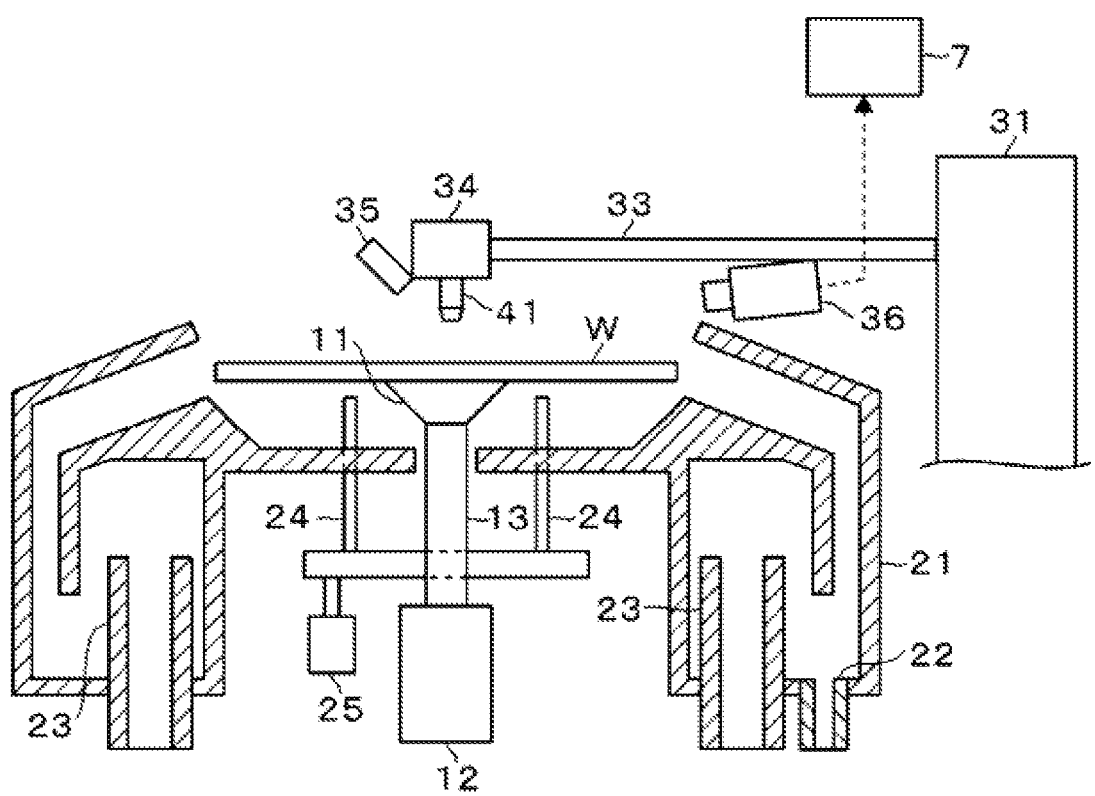
FIG. 2 is a vertical cross-sectional view of the resist film forming apparatus.

Reference numeral 11 in FIGS. 1 and 2 denotes a spin chuck which is a stage on which the wafer W is placed. The spin chuck 11 attracts a central portion of a rear surface of the wafer W and holds the wafer W horizontally. In FIG. 2, reference numeral 12 denotes a rotation mechanism which is connected to the spin chuck 11 via a vertical shaft 13. The spin chuck 11 is rotated by the rotation mechanism 12 so that the wafer W held by the spin chuck 11 is rotated about a central axis of the spin chuck 11.

Reference numeral 21 in FIGS. 1 and 2 denotes a cup which is provided to surround the wafer W held by the spin chuck 11 in order to receive liquid that is scattering from or dropped from the rotating wafer W. Reference numeral 22 in FIG. 2 denotes a drain port that is opened in the bottom of the cup 21. In FIG. 2, reference numeral 23 denotes an exhaust pipe provided upright from the bottom of the cup 21. The exhaust pipe 23 exhausts the interior of the cup 21 during the processing of the wafer W in the resist film forming apparatus 1. In FIGS. 1 and 2, reference numeral 24 denotes three vertical lifting pins (only two are illustrated in FIG. 2) which are provided at an interval in a rotational direction of the wafer W. The lifting pins 24 are vertically moved up and down by a lifting mechanism 25 to deliver the wafer W between a transfer mechanism (not illustrated) and the spin chuck 11.

Reference numeral 31 in FIGS. 1 and 2 denotes a movement part provided outside the cup 21 to horizontally move along a guide 32. An arm 33 extends horizontally from the movement part 31 so as to be orthogonal to a movement direction of the movement part 31. The arm 33 vertically moves up and down by the movement part 31. A nozzle holder 34 is provided at the tip end of the arm 33. A nozzle 41 is held below the nozzle holder 34. A large number of nozzles 41 are provided, for example, along the horizontal movement direction of the arm 33. In FIG. 1, only two nozzles 41 are shown to be provided. The two nozzles 41 may be referred to as 41A and 41B, respectively, in order to distinguish them from each other. Each nozzle 41 can be moved with the operation of the movement part 31 between a standby part 14 described below and an ejection position at which the resist is ejected from above the center of the wafer W.

An illuminator 35 is provided at a side opposite a side connected to the arm 33 in the nozzle holder 34, and irradiates each nozzle 41 with light. A camera 36, which is a capturing part, is provided at the side of a bottom surface of the arm 33, and captures an image of each nozzle 41 illuminated with light by the illuminator 35. The camera 36 transmits the image data acquired by the capturing to a controller 7 described later. The image data is data that includes brightness information about the captured area. An optical axis of the camera 36 is directed obliquely downward. The camera 36 captures an image of each liquid level in flow paths 42 (to be described later) provided inside each nozzle 41 from slightly above.

Figure 3:
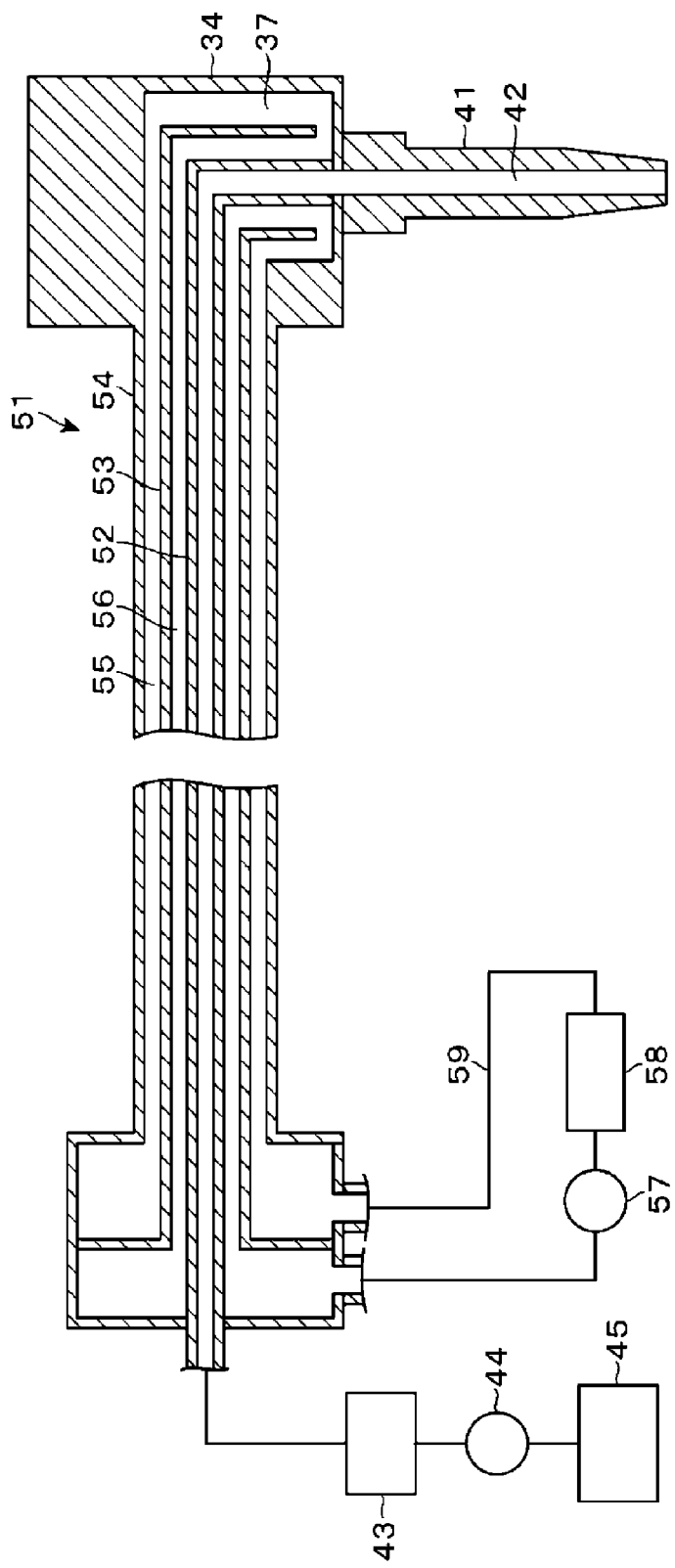
FIG. 3 is a vertical cross-sectional view of a nozzle and a pipe provided in the resist film forming apparatus.

A configuration of the nozzle 41 and a pipe connected to the nozzle 41 will be described with reference to FIG. 3. The nozzle 41 is a vertically-elongated cylindrical body. A lower peripheral surface of the nozzle 41 is bent with respect to an upper peripheral surface thereof in a side view. The lower portion of the nozzle 41 has a conical shape. A flow path 42 is provided in the nozzle 41 so as to eject the resist vertically downwards. The nozzle 41 is configured such that an image of the liquid level in the flow path 42 can be captured by the camera 36. Specifically, the nozzle 41 is configured to transmit the light emitted from the illuminator 35 with a high transmittance. The transparency of the nozzle 41 may be high or low as long as the light can be transmitted in that manner. The light emitted from the illuminator 35 may be, for example, infrared light or visible light.

One end of a triple pipe 51 provided for each nozzle 41 are connected to the nozzle holder 34. Respective pipes constituting the triple pipe 51 will be referred to as an inner pipe 52, a middle pipe 53, and an outer pipe from the inner side to the outer side. Illustration of the triple pipe 51 is omitted in FIGS. 1 and 2. A flow path 56 between the inner pipe 52 and the middle pipe 53 and a flow path 55 between the middle pipe 53 and the outer pipe 54 are connected to each other via a flow path 37 provided in the nozzle holder 34. In addition, the other end of the triple pipe 51 is connected to a pipe 59 which connects the flow path 55 and the flow path 56 and includes a pump 57 and a temperature adjustment mechanism 58 provided therein.

The flow paths 55, 56, and 37 and a flow path in the pipe 59 function as a circulation path through which fluid such as water circulates. The pump 57 suctions water from the flow path 56 and ejects the water toward the flow path 55. The temperature adjustment mechanism 58 adjusts a temperature of the water supplied from the upstream side with the operation of the pump 57 and supplies the water to the downstream side. For example, the pump 57 and the temperature adjustment mechanism 58 are shared by the triple pipe 51. During the operation of the resist film forming apparatus 1, the pump 57 periodically performs the above-described suction and ejection operations, so that the water (temperature-adjusted water) pulsates in the circulation path. The nozzle 41 supported in a suspended state by the aforementioned arm 33 receives shaking generated due to the pulsation of the temperature-adjusted water so that the nozzle 41 vibrates slightly and periodically mainly in the vertical direction. Accordingly, a combination of the flow paths 55, 56, and 37, the flow path in the pipe 59, and the pump 57 constitutes a vibration applying part.

The interior of the inner pipe 52 corresponds to the flow path 37 for the resist. A temperature of the resist flowing through the flow path 37 is adjusted by the circulation of the temperature-adjusted water. An upstream side of the inner pipe 52 is connected to a resist source 45 through a sequence of a suck-back valve 43 and a pump 44. The resist stored in the resist source 45 is forcibly fed to the nozzle 41 by the pump 44 which is a processing liquid supply part. Further, a portion of the inner pipe 52, which is positioned downstream from the suck-back valve 43, is suctioned by the suck-back valve 43 functioning as a suction part, so that the portion has a pressure that is negative against the upstream side. Thus, liquid is suctioned inward of the flow path 42 of the nozzle 41 from the outside, and the liquid is introduced to the side of the inner pipe 52 from the flow path 42 of the nozzle 41.

The suck-back valve 43, the pump 44, and the resist source 45 are provided for each nozzle 41. Each nozzle 41 is able to individually eject the resist and to form an air layer and a thinner layer in the flow path 42, which will be described later. Further, resists of different types are stored in respective resist sources 45. That is, different resists are ejected from respective nozzles 41, and processing is performed using the resist selected according to the lot of the wafer W.

The standby part 14 is provided outside the cup 21. When no wafer W is processed, each nozzle 41 waits with each nozzle 41 accommodated in a recess 15 provided in the standby part 14 from above. The standby part 14 is configured to be capable of supplying a thinner (a liquid other than the processing liquid) acting as an anti-drying liquid into the recess 15 and discharging liquid from the recess 15. Therefore, the standby part 14 is configured as an anti-drying liquid supply part.

Next, a state of the nozzle 41 available when viewed along the optical axis of the camera 36 will be described with reference to FIG. 4. In cooperation between the supply of the thinner in the standby part 14 and the suction performed by the suck-back valve 43 described above, there may be obtained a state (sealed state) in which an air layer 61, a thinner layer 62, an air layer 63, and a resist layer 64 are formed sequentially toward the upstream side inside the flow path 42 of the nozzle 41. Each nozzle 41 on standby in the standby part is brought in the sealed state. In the schematic view of FIG. 4, only the nozzle 41A is illustrated to be in the sealed state. The formation of the sealed state makes it is possible to suppress solidification of the resist in the flow path 42 due to drying.

Since the sealed state is formed as described above, liquid levels 65 are formed between each of the thinner layer 62 and the resist layer 64 and each of the air layers 61 and 63. The air layer 63 is formed to prevent the thinner from penetrating from the thinner layer 62 into the resist layer 64. The air layer 61 is formed to prevent the thinner from falling from the nozzle 41 while the nozzle 41 is moving.

Immediately before the nozzle 41 is carried out from the standby part 14 for processing the wafer W, only the nozzle 41, which performs processing on the wafer W, ejects the resist into the recess 15 of the standby part 14 (dummy dispensing) by the operation of the pump 44. Thus, the air layers 61 and 63 and the thinner layer 62 are removed. After the dummy dispensing, in order to prevent the resist from dropping as droplets from the flow path 42 of the nozzle 41, suction is performed by the suck-back valve 43 so that the liquid level 65 of the resist layer 64 in the flow path 42 is pulled up. As a result, an ejection preparation state is established. In FIG. 4, the nozzle 41B is illustrated to be in the ejection preparation state. After one nozzle 41 is in the ejection preparation state in this way, each nozzle 41 is carried out from the standby part 14.

Next, the processing of the wafer W in the resist film forming apparatus 1 will be described. In the standby part 14, each nozzle 41 is waiting in the standby part 14 in the sealed state. Meanwhile, a first wafer W in a lot is placed on the spin chuck 11. The dummy dispensing is performed with respect to the nozzle 41 preset to process the wafer W in the lot, and the ejection preparation state is established. Thereafter, each nozzle 41 moves up and moves from the recess 15 of the standby part 14 onto the wafer W, and the nozzle 41 which stays in the ejection preparation state moves to a processing position on the center of the wafer W.

Then, the resist is ejected from the nozzle 41. The wafer W is rotated, and the resist is spread to the peripheral portion of the wafer W to form a resist film. Thereafter, the nozzle 41 is temporarily retracted from the cup 21 to prevent interference with the wafer W to be unloaded, and the processed wafer W is unloaded from the resist film forming apparatus 1. Subsequently, a subsequent wafer W in the same lot as the processed wafer W is placed on the spin chuck 11 and is processed in the same manner as the previously-processed wafer W. Then, when the processing of all the wafers W belonging to the same lot is completed, the nozzle 41 return to the standby part 14, and the used nozzle 41 is brought into the sealed state.

In performing a series of processes in this way, a period in which the nozzle 41 are moved up from the recess 15 of the standby part 14 and is located above the standby part 14 will be referred to as a first abnormality detection period. In addition, a period immediately before the nozzle 41 moves onto the first wafer W in the lot and the resist is ejected onto the first wafer W will be referred to as a second abnormality detection period. During the first abnormality detection period and the second abnormality detection period, the emission of light from the illuminator 35 and the capturing of the nozzle 41 by the camera 36 are performed to determine, for each nozzle 41, whether or not an abnormality occurs for the position of the liquid level and the adhering of droplet.

Each of the first and second abnormality detection periods during which the capturing is performed as described above is a period during which the pump 44 and the suck-back valve 43 do not operate such that the positions of the liquid levels in the nozzle 41 can be detected as described later. That is, the first and second abnormality detection periods are continuous periods in which the ejection of the resist from the nozzle 41 and the introduction of the liquid from the nozzle 41 into the flow path 42 are not performed. That is, each of the first and second abnormality detection periods is a period from when the operation of each of the pump 44 and the suck-back valve 43 is stopped until either of the pump 44 and the suck-back valve 43 begins to operate. During each of the first abnormality detection period and the second abnormality detection period, the capturing is intermittently performed by the camera 36 to acquire a plurality of image data (frames). More specifically, the capturing is performed at a frame rate of, for example, 30 fps to 500 fps, more specifically, 30 fps to 120 fps and, for example, for 0.05 seconds to 1 second, more specifically, about 0.66 seconds. Therefore, the plurality of image data are acquired at different timings. The capturing may be performed for about 2 to 3 seconds in consideration of a cycle of the variation of the liquid levels.

Figure 4:
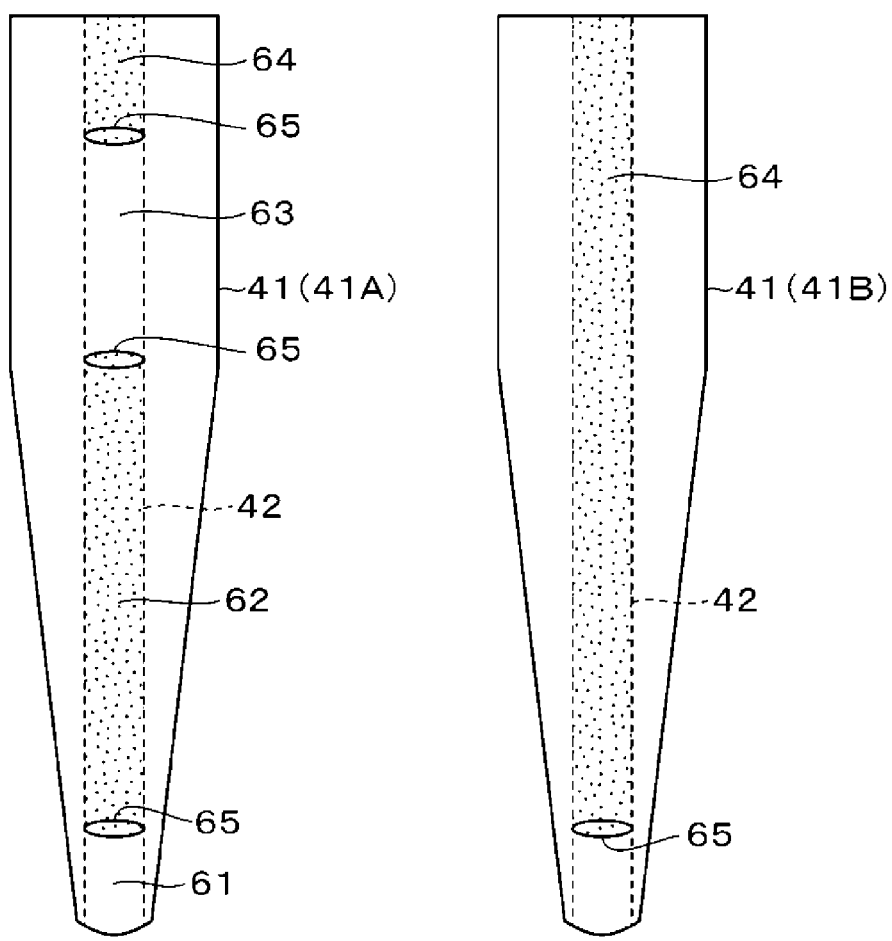
FIG. 4 is a side view of the nozzle.

In the nozzle 41 (41B) which is in the ejection preparation state described in FIG. 4, when the height of the liquid level 65 of the resist in the flow path 42 is too low, the resist may drop onto the wafer W as droplets. In contrast, when the height of the liquid level 65 of the resist in the flow path 42 is too high, the amount of the resist supplied onto the wafer W may become smaller than a set amount and thus a film thickness of the resist film may deviate from a set value. Meanwhile, in the nozzle 41 (41A) which stays in the sealed state, when the height of the liquid level 65 below the thinner layer 62 is too low, the thinner may drop onto the wafer W as droplets. In addition, when a distance between the liquid level 65 above the thinner layer 62 and the liquid level 65 below the thinner layer 62 is too short, that is, when a thickness of the thinner layer 62 is small, the resist layer 64 may be dried. As described above, when the position of each liquid level 65 in the flow path 42 of the nozzle 41 is an abnormal position, a problem may be caused in the processing of the wafer W. Therefore, it is desired to detect each liquid level 65 from the image data acquired by the camera 36.

Figure 5:
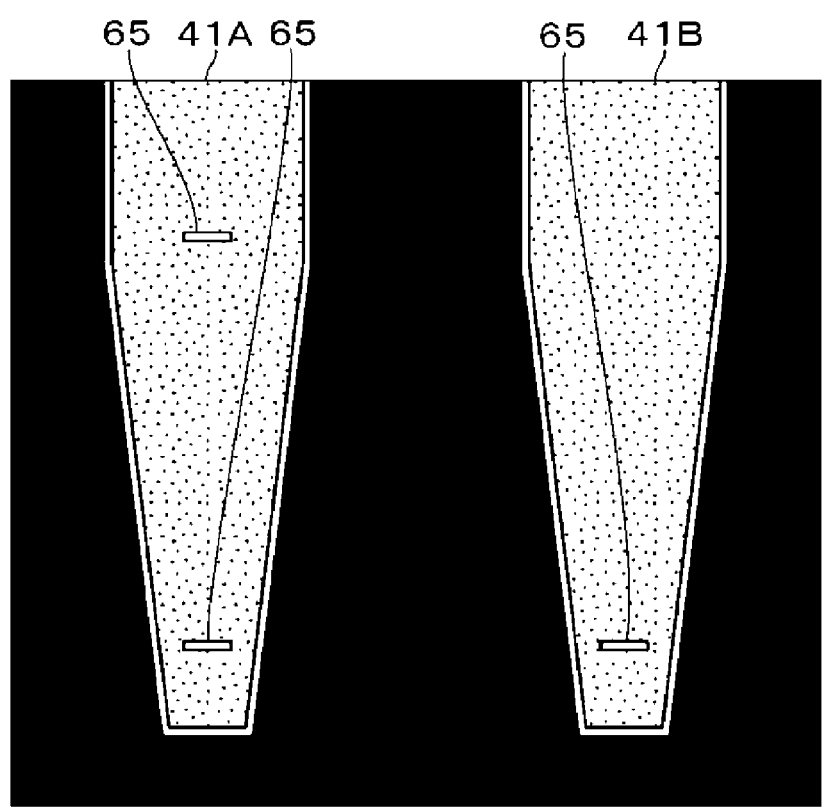
FIG. 5 is a schematic view of image data obtained by capturing an image of the nozzle.
Figure 7:
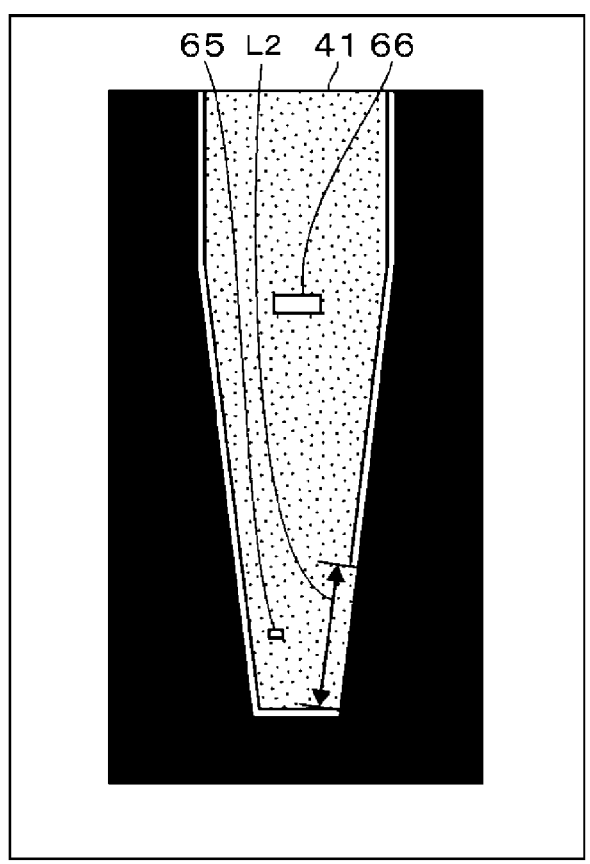
FIG. 7 is a schematic view of image data obtained by capturing an image of the nozzle.

FIG. 5 schematically illustrates an example of an ideal image from which the detection of the liquid levels 65 is possible, which is acquired by the camera 36. In FIG. 5, the nozzle 41A is in the sealed state and the nozzle 41B is in the ejection preparation state in a corresponding relationship with FIG. 4. In FIG. 5, no droplet (to be described later) adheres to the nozzle 41 as a capturing source in FIG. 5. In FIG. 5, FIG. 7 and the like (to be described later), a region having low brightness is marked by a solid black image, a region having a relatively low brightness is marked with dots, and a region having high brightness is marked by a white image. Further, the degree of brightness may be represented by the density of dots. Since the capturing is performed in the state in which outer edge of each nozzle 41 and each liquid level 65 shine (in a light reflection state) due to the irradiation with light from the illuminator 35, the outer edge of each nozzle 41 and each liquid level 65 have higher brightness than the surroundings in the image. Therefore, it is possible to specify the outer edges of the nozzle 41A in the sealed state and the nozzle 41B in the ejection preparation state based on the brightness, and to detect the positions of the liquid levels 65 in these nozzles 41A and 41B.

Figure 6:
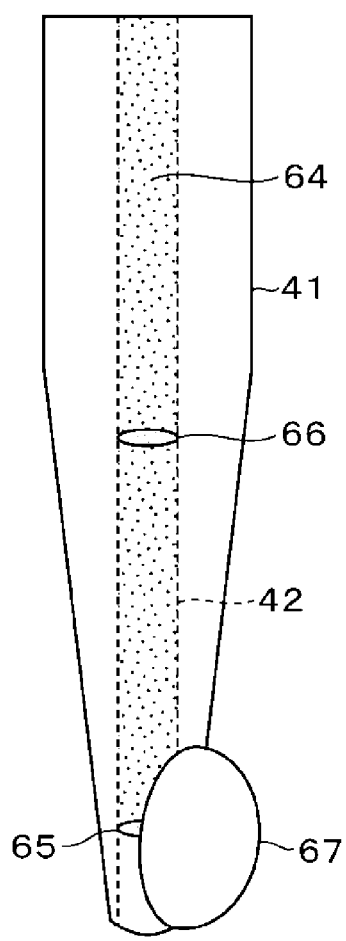
FIG. 6 is a side view of the nozzle.

However, there may a case in which the liquid levels 65 are not detected depending on the state of each nozzle 41. A specific example will be described with reference to FIGS. 6 and 7. FIG. 6 illustrates a nozzle 41 as a capturing source, and FIG. 7 is a schematic view of an image obtained from the nozzle 41 in FIG. 6. In the flow path 42, when the liquid level 65 of the resist is dried and solidified, a stain 66 having the same size as the liquid level 65 may remain as illustrated in FIG. 6. The stain 66 may also shine at the time of capturing like the liquid level 65, and may become a region having the same brightness or substantially the same brightness as that of the liquid level 65 in the image.

Further, for example, the thinner supplied in the standby part 14 may remain adhered as a droplet 67 on the outer peripheral surface of the nozzle 41. When the droplet 67 adhering to the outside of the nozzle 41 overlaps the liquid level 65, the light directed from the liquid level 65 toward the camera 36 is blocked so that the brightness of the liquid level 65 in the image may decrease. FIG. 7 illustrates an example in which, since the droplet 67 overlaps a portion of the liquid level 65, the brightness of the overlapping region decreases and thus the liquid level 65 seems to be absent. From the image in FIG. 7, it may be impossible to detect the liquid level 65 and the stain 66 may be detected as the liquid level 65.

Descriptions will be additionally given with reference to FIG. 7. When the droplet 67 overlaps the outer edge of the nozzle 41 when viewed from the camera 36, the light from the outer edge is less likely to enter the camera 36, like the light from the liquid level 65. That is, in the outer edge of the nozzle 41 when viewed from the camera 36, the portion overlapping the droplet 67 is represented as a region having low brightness in an image. Therefore, in FIG. 7, as is apparent from comparison with FIG. 5, a portion of the outer edge of the nozzle 41, which is covered with the droplet 67, seems to be absent.

In addition, as described above, the outer peripheral surface of the nozzle 41 has a bend portion. Depending on the position of the liquid level 65, light reflected from the liquid level 65 may be relatively greatly refracted at the bent portion of the nozzle 41. The reflected light may not sufficiently enter the camera 36 and the brightness of the bent portion may be lowered. As a result, the contrast between the liquid level 65 and the periphery of the liquid level 65 in the image may be decreased, which makes it difficult to detect the liquid level 65.

In addition, when the above-mentioned droplet 67 falls on the wafer W, a processing defect may occur. Accordingly, it is desired to detect the droplet 67 adhering to the nozzle 41 from the image, in addition to the liquid level 65. In detecting the droplet 67 as described above, as the adhered droplet 67 grows larger, the processing is affected more greatly when the droplet 67 falls on the wafer W. Therefore, it is desirable to estimate the size of the droplet 67 and to take a countermeasure according to the size.

The resist film forming apparatus 1 is configured to be able to deal with each of the problems described above. Next, the controller 7, which is a computer provided in the resist film forming apparatus 1 illustrated in FIG. 1, will be described. The controller 7, which is a detector that detects the liquid level 65, has a program storage (not illustrated). The program storage stores a program 71 incorporating instructions (a step group) for causing the resist film forming apparatus 1 to operate as described above and form the resist film on the wafer W. The program 71 causes the controller 7 to output a control signal to each part of the resist film forming apparatus 1 so as to form the resist film. According to the program 71, the detection of the liquid level 65 of each liquid, the detection of the droplet 67, and the estimation of the size of the droplet 67 are performed based on image data. Further, an abnormality is determined based on the detection result and the estimation result. The program 71 is stored in the program storage in the state of being stored in a storage medium such as a hard disc, a compact disc, a magneto-optical disc, a memory card, a DVD or the like.

Figure 8:
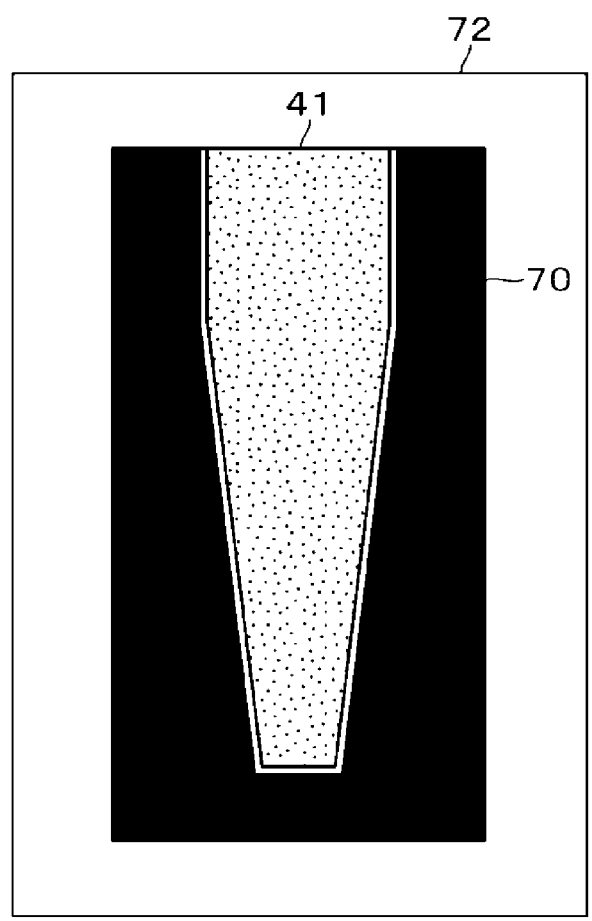
FIG. 8 is a schematic view illustrating an example of reference data of the nozzle.

A memory 72 included in the controller 7 stores reference data 70 for detecting whether or not the droplet 67 adheres to the nozzle 41. As illustrated in FIG. 8, the reference data 70 is data of the nozzle 41 in a state in which no droplet 67 adheres. More specifically, the reference data 70 is data for specifying the position of the outer edge of the nozzle 41 in the image. This data may be data that is not an image, such as coordinate data for specifying the position of the outer edge of the nozzle 41, or may be image data that specifying the outer edge of the nozzle 41. In FIG. 8, the reference data is represented as an image for the sake of convenience in description. In addition, the controller 7 includes an alarm output part 73 configured to output an alarm using voice or screen display. When an abnormality in the position of the liquid level 65 is detected or an abnormality caused due to the adhering of the droplet 67 is detected, the alarm issues.

Figure 9:
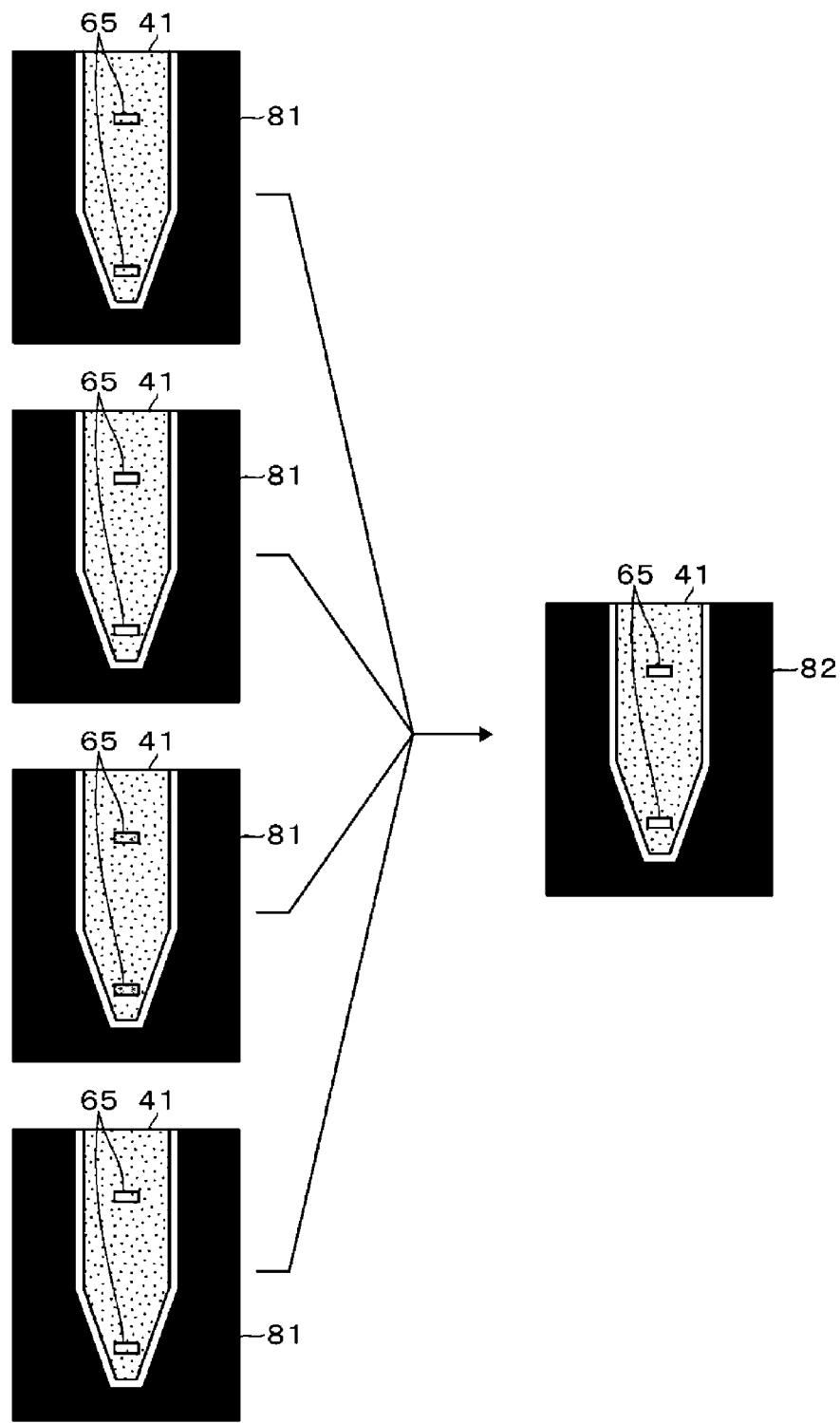
FIG. 9 is an explanatory view for explaining processing of the image data.

Next, a method of detecting the liquid level 65 by the controller 7 will be described. In FIG. 9, a plurality of image data 81 acquired during one abnormality detection period are vertically arranged in time series. Although the image of each nozzle 41 is collectively captured by the camera 36, the image data 81 for one nozzle 41 is illustrated for the sake of convenience in illustration.

The controller 7 creates image data 82 by superimposing the plurality of acquired image data 81. Such a superimposition processing (frame addition processing) is performed such that the brightness of a pixel at each position of the image data 82 has the maximum value among brightness values of pixels at the same positions in the plurality of image data 81. That is, a schematic description will be given assuming that the image data (which may be referred to as a MAX image) 82 is created from four image data 81. The brightness values of pixels at the same positions in the four image data 81 are assumed to be 30, 40, 50, and 60, respectively. In that case, the brightness of the pixel at the respective position of the image data 82 is set to the maximum value of 60 among 30, 40, 50, and 60. That is, by comparing the pixels at the same positions in the plurality of image data 81, the pixel having the maximum brightness is selected and set as the pixel of the image data 82. Similarly, image data (MIN image) is created by superimposing the plurality of acquired image data 81. The brightness of the pixel at each position of the MIN image has the minimum value among the brightness values of the pixels at the same positions in the plurality of image data 81.

Subsequently, the controller 7 specifies the outer edge of the nozzle 41 from the MAX image 82, for example, based on the brightness, and further specifies a region in which the flow path 42 is located from the outer edge. Then, as an outline of the detection, it is determined whether or not there is a group (feature region) of pixels having a brightness value larger than a preset value and having a size within a preset range in each of the MAX image 82 and the MIN image of the flow path 42. When a difference in the number of pixels (area) between the MAX image and the MIN image in the feature region is relatively large, such a difference may mean that a relatively large fluctuation in luminance occurs due to the shaking, that is, the feature region is the liquid level 65. Accordingly, the feature region in which the difference in the number of pixels is larger than a threshold and, for example, a gravity center of the feature region falls within a threshold from the central line of the nozzle 41 in the vertical direction, is detected as the liquid level 65. Meanwhile, when the brightness difference is equal to or less than the threshold, the feature region is detected as the stain (including scratch) 66.

More specifically, the method of detecting the liquid level 65 using the MAX image and the MIN image will be described. In addition, in step S3 of a flow described later, the liquid level 65 is specified, for example, in the following manner. The MAX image is binarized using, for example, a brightness threshold of 40, and a binarized area (a white area which corresponds to the above-mentioned feature region) that is a candidate for the liquid level 65 is specified from the binarized image. Similarly, the MIN image is binarized using, for example, a brightness threshold of 40, and a binarized area that is a candidate for the liquid level 65 is specified from the binarized image. Then, regarding the number of pixels, the binarized area of the MAX image and the binarized area of the MIN image are compared with each other, and a difference value in the number of pixels between the binarized areas is calculated. Substantially, it is determined whether the difference value in the number of pixels exceeds a threshold. When the difference value in the number of pixels exceeds the threshold and a positional relationship with the central line of the nozzle 41 satisfies the above-mentioned conditions, the specified feature region is determined as the liquid level 65. When the calculated number of pixels is equal to or less than the threshold, the specified feature region is regarded as the stain (including scratch) 66.

By binarizing each of the MAX image and the MIN image as described above, it is possible to limit the range in which the feature region that is a candidate of the liquid level 65 exists. Thus, it is easy to perform comparison processing of the MAX image and the MIN image (calculating the difference in the number of pixels). In the above-described example, the binarization is performed in advance in order to specify the feature region. However, if the region in which the feature region is predicted to appear in the image is already known, the binarization may be performed after the feature region is specified, and the aforementioned comparison processing may be performed.

The amount of light entering the camera 36 from the liquid level 65 may be small due to the influence of the adhered droplet 67 and the influence of the shape of the nozzle 41 as described above. However, the brightness of the pixels corresponding to the liquid level 65 in the image data 82 is equal to or higher than the brightness of the pixels corresponding to the liquid level 65 in the image data 81. That is, in the image data 82, the contrast between the pixels corresponding to the liquid level 65 and the pixels around the liquid level 65 becomes high. Accordingly, by detecting the liquid level 65 using the image data 82 as described above, it is possible to improve the detection accuracy, compared with the case in which the liquid level 65 is detected using one image data 81.

Additional descriptions will be made on the above example. As described above, the nozzle 41 vibrates slightly due to the circulation of the temperature-adjusted water, and the vibration causes the shaking of the liquid level 65. Therefore, the intensity of the light entering the camera 36 from the liquid level 65 changes with time. As a result, for example, the liquid level 65 may appear to blink in time series. Accordingly, in one image data 81, the brightness of the liquid level 65 may be low, while in other image data 81, the brightness of the liquid level 65 may be high. According to this method, it is possible to prevent the detection of the liquid level 65 from becoming impossible due to the detection being performed only on the basis of the image data 81 in which the brightness of the liquid level 65 is low.

Depending on factors such as the viscosity and color of the liquid, a state in which the liquid level 65 periodically vibrates may be observed, rather than that the liquid level 65 appears to blink, when seen the images in time series. Since the liquid level 65 is a fluid, the vibration of the liquid level 65 is larger than the vibration of the nozzle 41. The controller 7 is capable of detecting the liquid level 65 based on the vibration (shaking) of the liquid level 65.

The detection of the liquid level 65 based on the vibration will be described in detail. Based on the plurality of image data 81 acquired in one abnormality detection period, the outer edge of the nozzle 41 is specified with the brightness, and the range corresponding to the flow path 42 of the nozzle 41 is also specified. Then, the feature region (a group of pixels having a predetermined size and a predetermined brightness) located in the range is estimated as the liquid level 65. From the plurality of image data 81, the image data 81 in which the feature region estimated to be the liquid level 65 exists is selected. Subsequently, in each of the selected image data 81, for example, the gravity center of the feature region estimated to be the liquid level 65 is calculated. Then, a displacement amount of the gravity center between the image data 81 is detected for each feature region. The feature region in which the displacement amount exceeds a preset reference value is specified as the liquid level 65.

Figure 10:
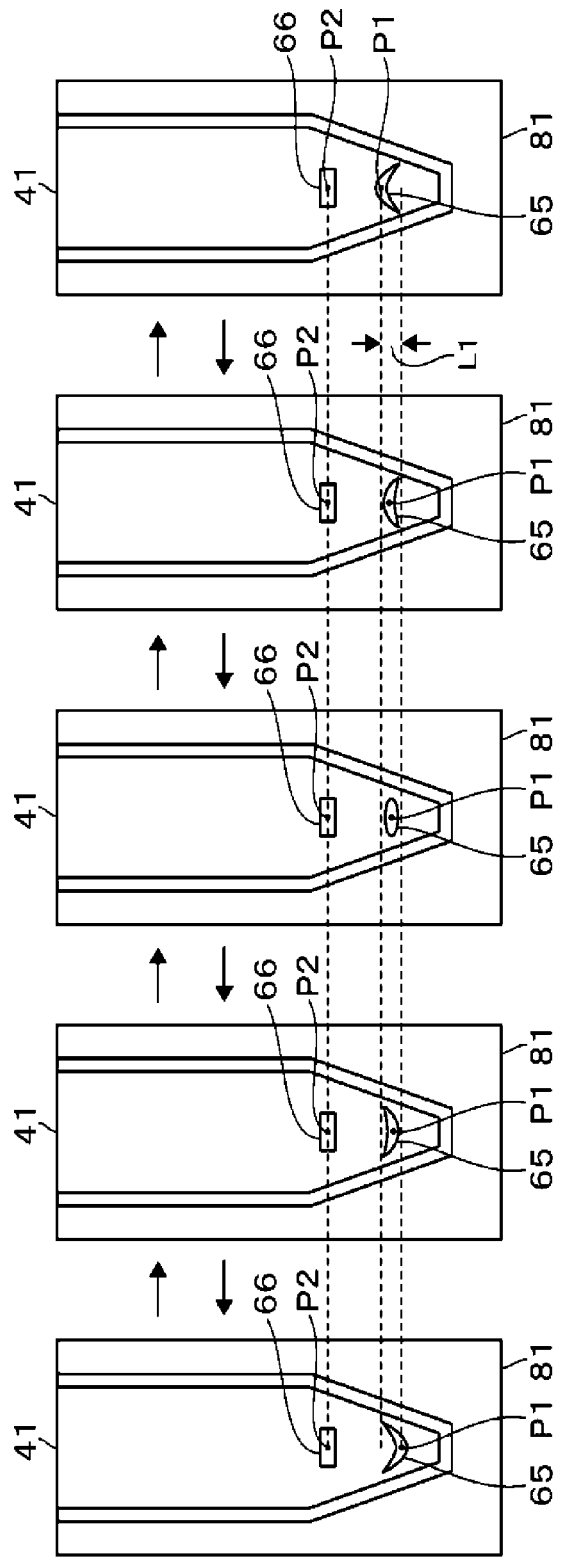
FIG. 10 is an explanatory view for explaining processing of the image data.

The method of detecting the liquid level 65 will be described more specifically with reference to FIG. 10. FIG. 10 schematically illustrates the image data 81 selected as having the feature region estimated to be the liquid level 65 and arranged in time series, wherein the state of the image transits sequentially as indicated by the arrows. In addition, in FIG. 10, for the sake of preventing the figure from becoming unclear, the dots and the solid black image added to show lightness and darkness in each figure showing the above-mentioned images, are omitted.

In the example illustrated in FIG. 10, it is assumed that the feature region corresponding to the liquid level 65 and the feature region corresponding to the stain 66 described with reference to FIG. 6 are estimated as the liquid level 65, and that the gravity center of each of the feature regions is calculated. In FIG. 10, the actual gravity center of the feature region of the liquid level 65 is indicated as P1, and the actual gravity center of the feature region of the stain 66 is indicated as P2. The displacement amount of the gravity center P1 (indicated as L1 in FIG. 10) between the image data 81 and the displacement amount of the gravity center P2 between the image data 81 are calculated. Here, it is assumed that the displacement amount of the gravity center P2 is substantially zero, which does not exceed a reference value, and that the displacement amount L1 of the gravity center P1 exceeds a reference value. Accordingly, the feature region in which the displacement amount of the gravity center P1 exceeds the reference value is correctly specified as the liquid level 65, and the feature region corresponding to the stain 66 is not specified as the liquid level 65. That is, the liquid level 65 is specified based on a change in position of brightness in a preset region between the image data 81.

Subsequently, a method of detecting the droplet 67 by the controller 7 will be described. The reference data 70 of the nozzle 41 described with reference to FIG. 8 is used for this detection. The controller 7 detects the outer edge of the nozzle 41 in the image based on the brightness of each pixel of the acquired image. Then, the controller 7 compares the detected outer edge with the outer edge of the nozzle 41 in the reference data 70 to detect whether or not a portion in the outer edge of the nozzle 41 disappears in the acquired image. When the reference data 70 is coordinate data, the detection of the outer edge of the nozzle 41 in the image corresponds to specifying the coordinates of the outer edge. The controller 7 compares the specified coordinates with the coordinates of the reference data 70 to determine whether or not there is a missing portion. As described above, the plurality of image data are acquired in one abnormality detection period. However, for example, one arbitrary image data 81 may be used to detect the missing portion of the outer edge.

When the missing portion of the outer edge is detected, the droplet 67 is considered to adhere, and the length of the missing portion (length of the missing portion of the outer edge of the nozzle 41) L2 (see FIG. 7) is detected. That is, a distance at which the outer edge of the nozzle 41 detected from the image data 81 does not overlap the outer edge of the nozzle 41 in the data stored in advance is obtained. The length L2 of the missing portion is regarded as corresponding to the size of the droplet 67, and the abnormality determination is performed as described later.

Figure 11:
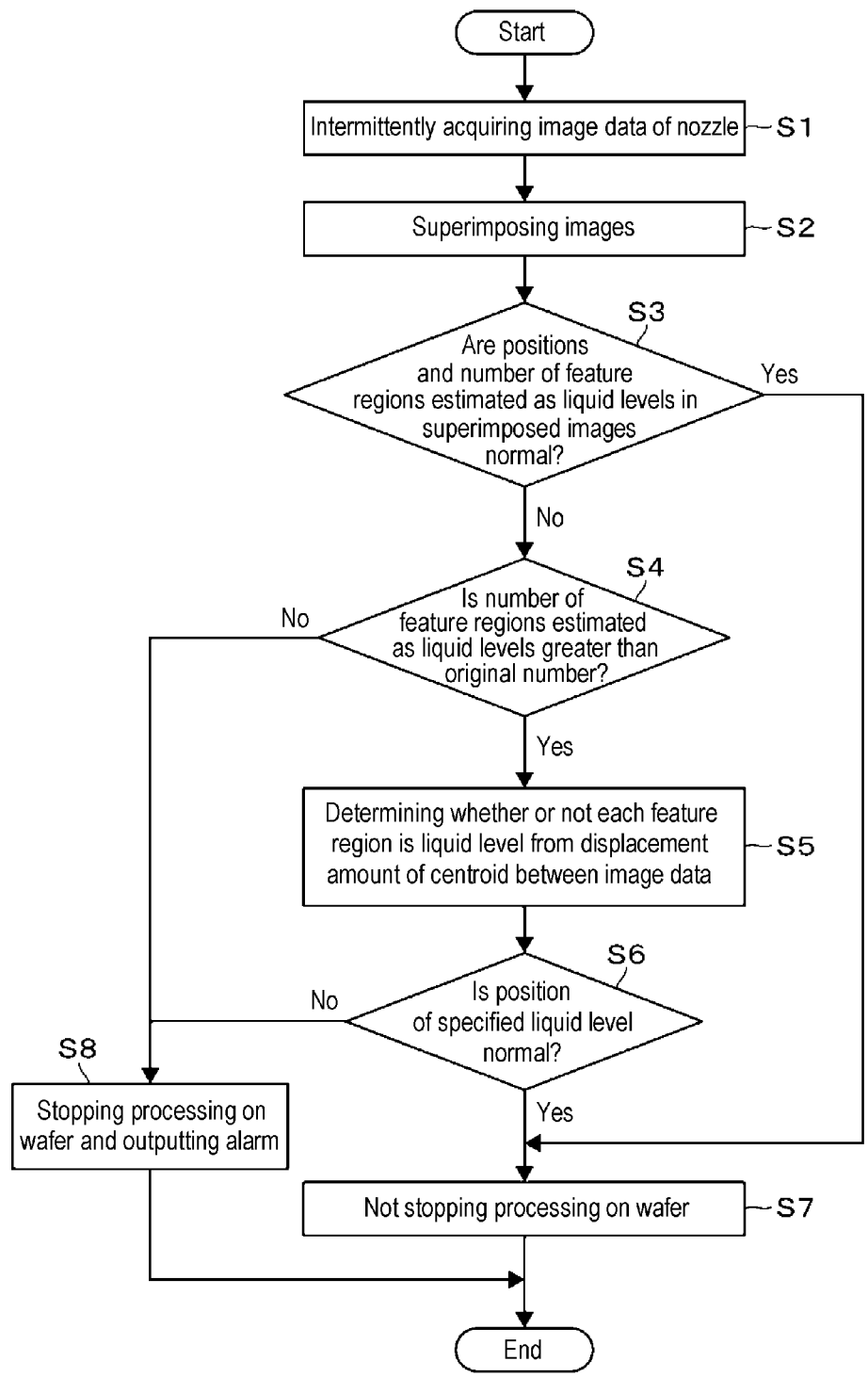
FIG. 11 is a flowchart for explaining a process of detecting an abnormality in the nozzle.
Figure 12:
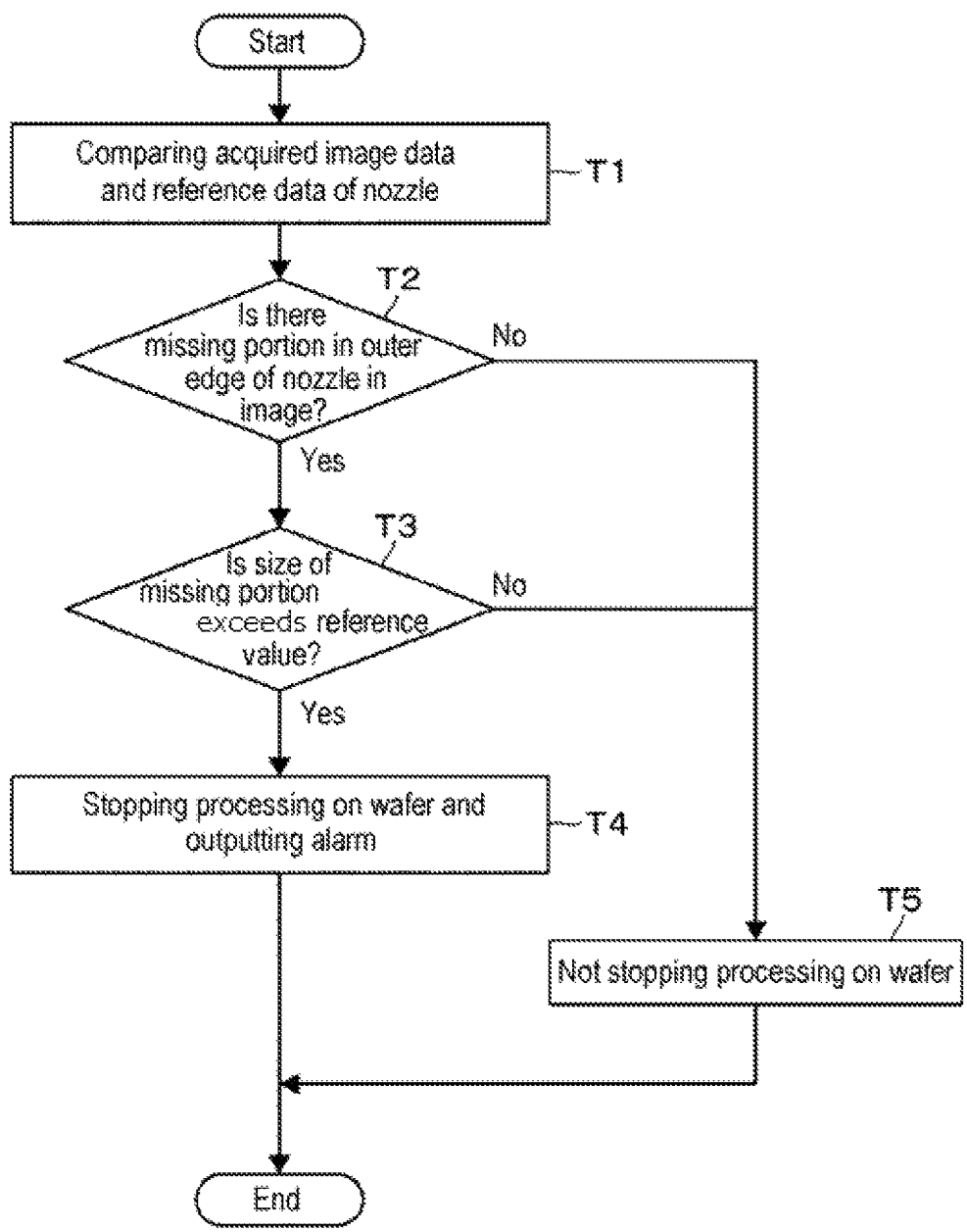
FIG. 12 is a flowchart for explaining a process of detecting an abnormality in the nozzle.

Next, an example of an abnormality determination flow for the nozzle 41, including the detection of the liquid level 65 and the droplet 67, which is performed by the controller 7 in the abnormality detection period, will be described with reference to flowcharts of FIGS. 11 and 12. Here, a procedure of performing the abnormality determination in the first abnormality detection period when the nozzle 41 is transferred from the standby part 14 described above will be described.

First, when the nozzle 41 is moved upward from the standby part 14, the illuminator 35 irradiates the nozzle 41 with light, and the camera 36 captures an image of the nozzle 41. As a result, the plurality of image data 81 are acquired at the above-mentioned frame rate (step S1 in FIG. 11). Subsequently, based on the acquired image data 81, the superimposed image data (MAX image) 82 and the MIN image are created as described above with reference to FIG. 9 (step S2). Then, based on the MAX image 82 and the MIN image, it is determined whether or not the number and positions of the liquid levels 65 are normal. More specifically, it is determined whether or not a group (feature region) of pixels having the above-described predetermined brightness and predetermined size is located in an appropriate number within the range of the flow path 42 in the image (step S3). In addition, since the positions and the number of liquid levels 65 are different between the nozzle 41 (41A) in the sealed state and the nozzle 41 (41B) in the ejection preparation state, the determination is performed for, for example, each of the nozzle 41 (41A) in the sealed state and the nozzle 41 (41B) in the ejection preparation state based on a preset standard.

When it is determined in step S3 that an abnormality occurs in the number and positions of the liquid levels 65, it is determined whether or not the number of feature regions in the image data 82 is greater than a specified value. That is, it is determined whether the number of feature regions estimated to be the liquid level 65 in the image is larger than the original number (step S4). When it is determined in step S4 that the number of feature regions is larger than the specified value, there is a possibility that the stain 66 adheres to the nozzle 41. Therefore, as described above with reference to FIG. 10, in the image data 81 in which each feature region exists, the gravity center of each feature region is calculated, the displacement amount of the gravity center between the image data 81 is detected, and the detected displacement amount and the reference value are compared with each other. It is therefore determined whether or not each feature region is the liquid level 65 so as to specify the liquid level 65 (step S5). Then, it is determined whether a position of the specified liquid level 65 is normal (step S6).

When it is determined in step S6 that the position of the liquid level 65 is normal, and when it is determined in step S2 that the number and position of the liquid levels 65 are normal, the processing on the wafer W is not stopped because there is no abnormality in the liquid level 65 (step S7). Meanwhile, when it is determined in step S6 that the position of the liquid level 65 is abnormal, and when it is determined in step S4 that the number of feature regions is not greater than the original number, an alarm is output and the processing on the wafer W is stopped. Accordingly, the transfer of the nozzle 41 above the wafer W is stopped (step S8). In step S3, it is determined whether or not the number of liquid levels is normal. Thus, the fact that it is determined in step S4 that the number of feature regions is greater than the origin number as described above and thus the state is not abnormal means that a liquid level 65 to be detected has not been detected.

As described above, the abnormality determination is performed on the liquid level 65, and the abnormality determination is also performed on the droplet 67. First, the reference data 70 and one of the acquired image data are compared (step T1 in FIG. 12). As described above with reference to FIG. 7, it is determined whether or not there is a missing portion in the outer edge of the nozzle 41 in the acquired image (step T2). When it is determined in step T2 that there is the missing portion in the outer edge, it is determined whether or not the size L2 of the missing portion exceeds a reference value (step T3). As described above, the size L2 of the missing portion corresponds to the size of the droplet 67. When the size L2 of the missing portion exceeds the reference value, the droplet 67 is likely to drop from the nozzle 41. Thus, an alarm is output and the processing on the wafer W is stopped. Accordingly, the transfer of the nozzle 41 to a position above the wafer W is stopped (step T4).

When it is determined in step T2 that there is no missing portion in the outer edge of the nozzle 41, and when it is determined in step T3 that the size of the droplet 67 is less than or equal to the reference value, the processing on the wafer W is not stopped (step T5). When it is determined that the processing on the wafer W is not stopped in step S7 of the flow for the liquid level 65, and that the processing on the wafer W is not stopped in the step T5, it is determined that there is no abnormality due to the liquid level 65 and the droplet 67. Thus, the nozzle 41 is transferred above the wafer W.

Although the flow performed in the first abnormality detection period immediately after the nozzle 41 is carried out from the standby part 14 has been described, the same flow is also performed in the second abnormality detection period after the nozzle 41 is positioned above the wafer W. In the flow performed in the second abnormality detection period, when it is determined to stop the processing of the wafer W in steps S8 and T4, the ejection of the resist from the nozzle 41 transferred above the wafer W to the wafer W is stopped. Depending on the timing of stopping the ejection of the resist, for example, the processing on a wafer W of a subsequent lot to be transferred to the resist film forming apparatus 1 may be stopped. That is, the transfer of the subsequent lot to the resist film forming apparatus 1 may be stopped. Further, there may be a case in which a module block is executed. The module block is to control an operation of a transfer mechanism configured to transfer a wafer W to the resist film forming apparatus 1 such that the transfer of the wafer W of each lot that was to be transferred to the resist film forming apparatus 1 is stopped.

In the resist film forming apparatus 1, the liquid level 65 in the flow path 42 of the nozzle 41 is detected based on the plurality of image data 81. Thus, the liquid level 65 can be detected with high accuracy. Accordingly, it is possible to reliably prevent the occurrence of an abnormality in liquid processing due to an abnormality in the position of the liquid level 65. The shaking of the liquid level 65 is determined by detecting the variation in the position of the feature region estimated to be the liquid level 65 between the image data 81. By detecting the shaking of the liquid level 65, it is possible to distinguish the liquid level 65 and a deposits on the nozzle 41 other than the liquid level 65 with high precision. As a result, it is possible to detect the liquid level 65 more reliably. In addition to the detection using the shaking of the liquid level 65, the liquid level 65 is also detected by superimposing the image data 81. By using different detection methods together, it is possible to detect the liquid level 65 more reliably.

In the resist film forming apparatus 1, by detecting the presence or absence of the droplet 67 adhering to the nozzle 41 based on the image data 81, it is possible to prevent the occurrence of an abnormality in the liquid processing more reliably. In addition, from this image data 81, the size of the missing portion in the outer edge of the nozzle 41, which corresponds to the size of the droplet 67 adhering to the nozzle 41, is detected. The abnormality determination is performed based on the detected size. Accordingly, it is possible to prevent the processing from being stopped more than necessary. However, once the droplet 67 is detected, the processing on the wafer W may be stopped regardless of the size of the droplet 67.

In order to detect the presence or absence of the droplet 67, one image data 81 is compared with the reference data. However, such a comparison is not limited to using one image data 81. For example, the presence or absence of the droplet 67 may be detected by comparing the superimposed image data 82 described above with reference to FIG. 9 with the reference data.

The detection of the liquid level 65 based on the vibration is not limited to the above description. For example, in addition to determining whether or not the displacement amount of each of the gravity centers P1 and P2 of the feature regions calculated as described above exceeds the reference value, whether or not the movement of each of the gravity centers P1 and P2 is repeated in the vertical direction may be used as a criterion for determining whether or not the feature region is the liquid level 65. Furthermore, since the vibration of the nozzle 41 is periodic, the shaking of the liquid level 65 is also periodic. Accordingly, whether or not the vertical movements of the gravity centers P1 and P2 are periodic may be used as a criterion for determining whether or not the feature region is the liquid level 65. For example, a vibration period of the gravity center of the feature region may be obtained in advance by experiment. Whether or not a vibration period of the feature region obtained by the capturing matches the vibration period obtained in advance by experiment, may be used as the criterion. By determining whether a movement amount of an upper end or a lower end of the feature region exceeds a reference value, it may be determined whether or not the feature region is the liquid level 65. That is, the present disclosure is not limited to determining the liquid level 65 by calculating the gravity center P of the feature region.

While in the above embodiment, the image data 82 is produced by superimposing all the acquired image data, the image data 82 may be produced by superimposing only the image data acquired at arbitrary intervals. That is, the liquid level 65 may be detected by using only some of the large number of acquired image data 81. While in the above embodiment, the pixels at the same positions of the image data 81 are compared with each other to obtain the maximum value of the brightness, but the pixels at slightly deviated positions may be compared with each other. Specifically, since the nozzle 41 slightly vibrates as described above, the positions of the pixels of the image data 81 may be slightly different from each other. The image data 82 may be produced by overlapping the image data 81 such that the outer edges of the nozzle 41 in the image data 81 are aligned with each other, and obtaining the maximum value between the overlapped pixels at respective positions. In this way, by comparing the brightnesses of the pixels at the positions (including the same position) corresponding to each other between the images, it is possible to obtain the maximum value and specify the position of the liquid level 65, The determination as to whether or not to stop the processing illustrated in FIGS. 11 and 12 is an example. For example, when no liquid level 65 is detected and the droplet 67 is detected, it may be considered that the liquid level 65 is hidden by the droplet 67 as in the example illustrated in FIG. 7. Thus, the liquid level 65 may be regarded as normal, and the processing may be continued. With the resist film forming apparatus 1, both the liquid level 65 and the droplet 67 are detected as described above. Thus, there is an advantage in that it is possible to take highly flexible measures according to the detection results thereof.

In the case of vibrating the liquid level 65 to detect the liquid level 65, a vibrator such as a crystal vibrator may be provided on the arm 33 to vibrate the nozzle 41, thus shaking the liquid level 65. That is, the resist film forming apparatus 1 may have a configuration in which a mechanism that circulates a temperature-adjusted water is not provided. The resist film forming apparatus 1 may include, for example, a gas nozzle that ejects gas upward. For example, when capturing an image of the nozzle 41, the nozzle 41 may be disposed above the gas nozzle. A configuration, in which the liquid level 65 inside the nozzle 41 is shaken when the gas is sprayed from the gas nozzle onto a liquid layer inside the nozzle 41, may be adopted. That is, the present disclosure is not limited to the configuration in which the liquid level 65 is shaken by vibrating the nozzle 41. In addition, when the gas is sprayed, the droplet 67 adhering to the nozzle 41 may be blown off or the position thereof may be changed. Therefore, from the images during or before and after the spraying of the gas, it is possible to determine whether a substance adhering to the nozzle 41 is the droplet 67 or an adhered substance other than the droplet 67. In the above embodiment, the camera 36 and the illuminator 35 are provided on the arm 33. However, by providing the camera 36 and the illuminator 35 to be fixed to the cup 21, the abnormality determination may be performed only during a period immediately before the nozzle 41 ejects the resist. That is, the place where the camera 36 and the illuminator 35 are provided is not limited to the arm 33.

In the above embodiment, when the position of the liquid level 65 and the size of the droplet 67 is determined to be abnormal, the stop of the processing on the wafer W and the output of the alarm is taken as a countermeasure operation, but is not limited thereto. For example, the dummy dispensing may be performed after the nozzle 41 is returned to the standby part 14 or the removal of the droplet 67 may be performed by supplying a thinner to the standby part 14. In the above embodiment, when the size of the droplet 67 is relatively small, it is determined that no abnormality occurs, and no countermeasure operation is performed. In some embodiments, when the adhering of the droplet 67 is detected, it may be determined that an abnormality occurs regardless of the size of the droplet 67, and the above-mentioned countermeasure operations may be performed.

The present technology may be applied to various liquid processing apparatuses other than the resist film forming apparatus 1. For example, the present technology may be applicable to an apparatus in which a developer for developing an exposed resist film, a chemical liquid for forming an antireflection film, a chemical liquid for forming an insulating film or the like is supplied as a processing liquid from a nozzle to a wafer W. As another example, the present technology may be applicable to an apparatus in which a thinner supplied to a wafer W as pre-wetting before supplying a chemical liquid, a chemical liquid for forming a resist protection film, an adhesive for bonding the wafer W, or the like is ejected as a processing liquid from a nozzle to a wafer W. In the resist film forming apparatus 1 described above, for example, the pre-wetting is performed before supplying the resist to the wafer W. The description of a nozzle for performing the pre-wetting is omitted for the sake of avoiding complexity of description.

Although the camera 36 acquires monochrome image data, a camera configured to acquire color image data may be provided instead of the camera 36. In this case, the outer edge of the nozzle 41 and the liquid level 65 in the image data 81 and 82 may be specified based on, for example, RGB values of the image data instead of the brightness, as a pixel parameter. That is, it is possible to detect the position of the liquid level 65 and the droplet 67 based on the colors in the image. Accordingly, the present disclosure is not limited to using the brightness as a pixel parameter.

According to the present disclosure, it is possible to highly reliably prevent an abnormal processing from being performed when performing a liquid processing on a substrate.

It should be noted that the embodiments disclosed herein are exemplary in all respects and are not restrictive. The above-described embodiments may be omitted, replaced or modified in various forms without departing from the scope and spirit of the appended claims.

What is claimed is:

1. A liquid processing apparatus comprising:
   a stage on which a substrate is placed;
   a nozzle configured to supply a processing liquid to the substrate placed on the stage and perform a processing on the substrate;
   a nozzle holder configured to hold the nozzle;
   a triple pipe connected to the nozzle holder and including an inner pipe, a middle pipe, and an outer pipe from an inner side to an outer side;
   a capturing part configured to capture an image of the nozzle so as to acquire image data; and
   a detector configured to detect a liquid level based on a plurality of the image data acquired by the capturing part at different timings within a period in which a supply of the processing liquid from the nozzle is not performed, wherein the liquid level is formed by the processing liquid or a liquid other than the processing liquid in a processing liquid flow path provided inside the nozzle,
   wherein a temperature adjusting fluid for adjusting a temperature of the processing liquid is circulated through a first flow path between the outer pipe and the middle pipe and a second flow path between the middle pipe and the inner pipe by a pump,
   wherein the pump is configured to suction the temperature adjusting fluid from the first flow path and eject the temperature adjusting fluid toward the second flow path periodically so that the temperature adjusting fluid pulsates in the first flow path and the second flow path, and
   wherein the nozzle is vibrated in a vertical direction by the periodic suction and ejection of the pump.

2. The liquid processing apparatus of claim 1, wherein the detector is configured to detect the liquid level based on a change in corresponding positions between the plurality of the image data in a region in which parameters of pixels in the plurality of the image data fall within a preset range.

3. The liquid processing apparatus of claim 2, wherein the parameters of the pixels are brightnesses, and
   wherein the detector is configured to detect the liquid level based on a change in position of the region having a preset brightness between the plurality of the image data.

4. The liquid processing apparatus of claim 1, further comprising:
   a standby part provided outside the stage; and
   a memory in which reference data related to the nozzle is stored in advance,
   wherein the capturing part is configured to capture the image of the nozzle which is vibrating above the standby part, and
   wherein the detector is configured to determine whether or not a droplet adhering to an outside of the nozzle exists based on at least one of the plurality of the image data and the reference data.

5. The liquid processing apparatus of claim 1, further comprising:
   an anti-drying liquid supply part configured to supply an anti-drying liquid for preventing the processing liquid in the nozzle from drying to an outside of the nozzle; and
   a suction part configured to suction the anti-drying liquid from the nozzle,
   wherein the liquid other than the processing liquid is the anti-drying liquid, and the different timings are timings within a period in which the suction by the suction part is not performed.

6. The liquid processing apparatus of claim 1, wherein the detector is configured to detect the liquid level by comparing parameters of pixels at corresponding positions among the plurality of the image data.

7. The liquid processing apparatus of claim 6, wherein the parameters of the pixels are brightnesses,
   wherein the liquid processing apparatus further includes a controller configured to create superimposed image data by superimposing, for each position of the images, a maximum value among the brightnesses of the pixels at the corresponding positions among the plurality of the image data, and
   wherein the detector is configured to detect the liquid level based on the superimposed image data.

8. The liquid processing apparatus of claim 7, further comprising:
   a memory in which reference data related to the nozzle is stored in advance,
   wherein the detector is configured to determine whether or not a droplet adhering to an outside of the nozzle exists based on at least one of the plurality of the image data and the reference data.

9. The liquid processing apparatus of claim 8, wherein the controller is configured to estimate a size of the droplet and to output a control signal such that a countermeasure operation is performed based on the estimated size.

10. The liquid processing apparatus of claim 7, wherein the controller is configured to output a control signal such that a countermeasure operation is performed when a position of the detected liquid level is abnormal.

11. The liquid processing apparatus of claim 1, further comprising a standby part provided outside the stage,
    wherein the capturing part is configured to capture the image of the nozzle which is vibrating above the standby part.

* * * * *